United States Patent [19]

Depew

[11] Patent Number: 5,173,842
[45] Date of Patent: Dec. 22, 1992

[54] ELECTRICAL ASSEMBLY WITH DEFORMABLE BRIDGE PRINTED CIRCUIT BOARD

[75] Inventor: David T. Depew, Port Crane, N.Y.

[73] Assignee: International Business Machines Corporation, Armonk, N.Y.

[21] Appl. No.: 766,377

[22] Filed: Sep. 27, 1991

[51] Int. Cl.⁵ .......................................... H05K 7/02
[52] U.S. Cl. .................... 361/400; 361/406; 361/408; 361/426; 439/78
[58] Field of Search ............... 174/176, 191, 193, 267; 248/27.1, 27.3; 318/346, 254; 361/400, 404, 413, 406, 426, 407, 408; 439/55, 63, 78, 81, 82, 382, 629

[56] References Cited

U.S. PATENT DOCUMENTS

| | | | |
|---|---|---|---|
| 3,052,004 | 9/1962 | Wallshein | 439/83 |
| 3,528,050 | 9/1970 | Hindenburg | 439/83 |
| 3,617,980 | 11/1971 | Alkire et al. | 174/191 |
| 3,624,588 | 11/1971 | Farmer | 439/84 |
| 3,745,513 | 7/1973 | Gross | 174/267 |
| 3,848,947 | 11/1974 | Jambor | 439/78 |
| 3,899,231 | 8/1975 | Bray | 174/263 |
| 3,924,918 | 12/1975 | Friend | 439/46 |
| 4,027,128 | 5/1977 | Walker | 439/83 |
| 4,332,430 | 6/1982 | Clark | 439/83 |
| 4,422,128 | 12/1983 | Zurlinden et al. | 361/404 |
| 4,640,561 | 2/1987 | George | 439/83 |
| 4,797,110 | 1/1989 | Ponziani et al. | 439/83 |
| 4,845,592 | 7/1989 | Himes, Jr. et al. | 361/407 |
| 4,932,903 | 6/1990 | Bonhomme | 439/629 |
| 4,952,853 | 8/1990 | Archer | 318/254 |

Primary Examiner—Gerald P. Tolin
Assistant Examiner—D. Sparks
Attorney, Agent, or Firm—Lynn L. Augspurger

[57] ABSTRACT

An electrical assembly for a removable printed circuit board, wherein the printed circuit board is mounted on a plate and spaced from the plate. Electrical devices, particularly power devices, are mounted on the plate and electrically connected to the printed circuit board by a terminal providing for a flexible high current interface in the form of a deformable bridge interface connector which is inserted into the printed circuit board to provide a circuit connection to the power device. The deformable bridge interface connector is formed so as to permit three directional movement of the printed circuit board, a positive low resistance high current connection to the power devices and which can be disconnected by unscrewing screws connecting the bridge with a terminal post which is connected to the power device.

8 Claims, 2 Drawing Sheets

ELECTRICAL ASSEMBLY WITH DEFORMABLE BRIDGE PRINTED CIRCUIT BOARD

FIELD OF THE INVENTIONS

The present invention relates to electrical assemblies and particularly to an electrical assembly with a high current deformable bridge deformable terminal for a printed circuit board for use in attaching an electrical device to the board which accommodates movements of parts of the assembly and facilitates rework.

BACKGROUND OF THE INVENTIONS

There are countless electrical assemblies, many of which have terminals of some sort specifically designed for their intended purpose. There is, however, the problem of providing an assembly which may permit rework and which will accept and connect various terminals which may be connected to a printed circuit board.

U.S. Pat. No. 3,617,980 to Alkire et al, issued Nov. 2, 1971 discloses a printed circuit board clip connector that will accept contact pins of varying heights. This patent proposes that it will accept contact pins that are not perpendicular to the printed circuit board to which it is attached. However, in an electrical assembly with multiple pins mounted to a rigid heat sink at different angles, it would be a very difficult assembly process, as in this patent electrical continuity must rely on a spring contact.

U.S. Pat. No. 4,422,128 to Zurlinden et al, issued Dec. 20, 1983 illustrates a push on terminal clip, but with multiple pins which may not be perpendicular to a printed circuit board, soldering would prove to be a difficult process which could result in internal damage to a connected device.

Flexible Circuit connectors are not P.C.B. (printed circuit board) mounted in U.S. Pat. No. 4,640,561 to George, issued Feb. 3, 1987 which also uses an electrical connection which is a spring contact.

Other patents in the art include U.S. Pat. Nos. 3,052,004 to Wallshein, issued Sep. 4; 1962 which shows clamps for attachment to a wire; U.S. Pat. No. 3,528,050, to Hindenburg issued Sep. 8, 1970, illustrating a push-on grounding clip; U.S. Pat. No. 3,745,513 to Gross, issued Jul. 10, 1973 showing a strain relieving connector; U.S. Pat. No. 3,899,231 to Bray, issued Aug. 12, 1975 showing an electrical connector for printed electrical circuit panels. A connector between a mother and daughter board is shown by U.S. Pat. No. 3,924,918, to Friend, issued Dec. 9, 1975. Other printed circuit board connectors have three legs, as shown by U.S. Pat. No. 4,332,430 to Clark. Ribbon connectors for distributing power are shown by U.S. Pat. No. 4,845,592, to Himes, Jr. et al, issued Jul. 4, 1989, and U.S. Pat. No. 4,932,903 to Bonhomme, issued Jun. 12, 1990 illustrates a kind of deformable contact element.

However, in a multipin environment none of the foregoing terminals or their assemblies accommodates pins which may vary in direction and orientation during the process of manufacturing or thereafter. Such accommodation is needed.

SUMMARY OF THE INVENTIONS

The present invention relates to electrical assemblies and particularly to an electrical assembly with a terminal to a printed circuit board for use in attaching an electrical device to the board which accommodates movement of parts of the assembly and facilitates rework.

More particularly, the electrical assembly includes a removable printed circuit board which is mounted on a plate and spaced from the plate, and having electrical devices, particularly power devices, which are mounted on the plate and electrically connected to the printed circuit board by a terminal providing for a flexible high current interface in the form of a deformable bridge terminal member which is inserted for electrical conduction with a solder connection to the printed circuit board to provide a circuit connection to the power device, the deformable bridge is formed so as to permit three directional deformable pitch, roll, and yaw movement as well as permitting movement up and down with respect to the surface of the printed circuit board to provide a positive low resistance high current connection to the power devices and which can be disconnected by unscrewing screws connecting the bridge with a hexagonal section terminal post which is connected to the power device of the assembly.

The inventions will be described in greater detail with respect to the appended drawings.

BRIEF DESCRIPTION OF THE DRAWINGS

The inventions will be described now in greater detail with reference to the separate sheets of numbered appended drawings in which.

DETAILED DESCRIPTION OF THE PREFERRED EMBODIMENTS

Figure 1:
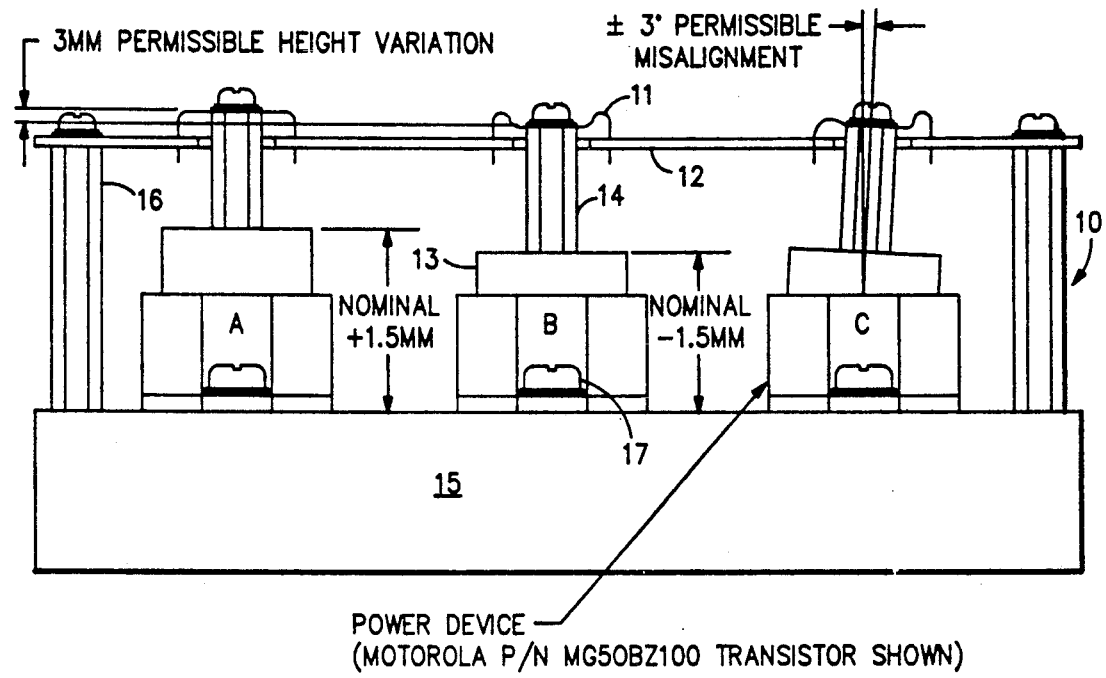
FIG. 1 shows a schematic diagram of the electrical assembly which illustrates three possible terminal connections in accordance with the present invention.

The present invention relates to electrical assemblies of the kind illustrated by FIG. 1 which illustrates an electrical assembly 10 with a terminal 11 attached to a printed circuit board 12 for use in attaching an electrical device 13 in the form of a power supply unit which is connected via a projecting terminal post 14 to the board by way of a screw 15 connection to the terminal post 14 which connection employs the deformable terminal member 11 to accommodate movement of parts of the assembly and facilitates rework.

Figure 2:
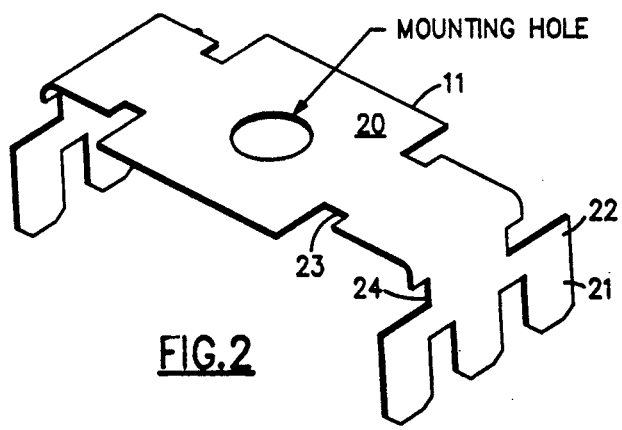
FIG. 2 shows a tilted perspective view of the deformable terminal is employed as part of the present invention.

More particularly, the electrical assembly includes a removable printed circuit board assembly which is mounted on a plate base member 15 which functions as a heatsink by support spacers 16 and is thereby spaced from the plate a distance which may vary during assembly. In the preferred embodiment shown, the spacing of the printed circuit board may have an assembly and rework variance of plus or minus 3 mm from the drawing standard. The printed circuit board which is spaced from the plate has the normal circuit lines formed thereon. These circuit lines connect various electrical devices which may be mounted directly above and onto the board, but also these boards will be connected to electrical devices, particularly power devices, which are mounted with a screw connection to the heatsink plate base member 15. These power supply devices are electrically connected to the printed circuit board by a deformable terminal bridge connector 11, as illustrated in FIG. 2. FIG. 2 shows in perspective view the deformable bridge terminal connector 11 which when soldered onto the printed circuit card 12 provides for a flexible high current interface in the form of this deformable bridge terminal member 11. The member 11 which is inserted for electrical conduction with a solder connection to the printed circuit board to provide a circuit connection to the power device 13. The deformable bridge terminal connector is formed so as to permit three directional deformable pitch, roll and yaw movement as well as permitting movement up and down with respect to the surface of the printed circuit board to provide a positive low resistance high current connection to the power devices and which can be disconnected by unscrewing screws connecting the bridge with a hexagonal section terminal post 14 which is connected to the power device 13 of the assembly 10.

The foregoing assembly 10 overcomes the inherent design problem which exists whenever more than one high current carrying power device (a diode, a transistor, etc.) must be electrically connected to a printed circuit board.

Typically these power devices must first be directly mounted via the screws 17 to the rigid heatsink plate 15 or other plate member such as a cold plate (which would be the plate 15) and then electrically connected to the printed circuit boards. For optimum performance the connecting length between the devices needs to be as short as possible. Therefor the deformable terminal bridge connector is mounted directly on the printed circuit board on top of the devices via the standoff terminal posts 14.

The problem with power devices is that with the proposed assembly the location, height and alignment of their terminals cannot be easily closely controlled in manufacture. Therefor the high current yet flexible interface which is provided in the form of a deformable terminal bridge connector 12 between the terminal standoff posts 14 and the printed circuit board accommodates the deformation which permits the alignment of location, height and pitch, roll yaw provided by the particular improved terminal bridge.

As will be seen by the connections illustrated by FIG. 1, the connections can be higher, as illustrated by the left most terminal, or lower, as illustrated by the center terminal. Alignment can be accommodated by the terminal as illustrated by the right most terminal illustrated in FIG. 1. The alignment may be plus or minus three degrees from a standard vertical orientation of the standoff terminal post 14. Because alignment may be in any direction, the terminal bridge accommodates pitch, roll and yaw of the connection seat surface 20 of the terminal bridge 11. Forked endpoints 21 are provided for the bridge allowing the bridge to be inserted into the printed circuit board and to draw solder down from the terminal bridge end to the connecting circuit.

The terminal bridge has two points allowing torsion of the seat. A first flexible torsion connection 23 is provided by edge punches into the side of the bridge, and a second flexible torsion connection 24 is provided by edge punches into the vertically oriented bridge end portion 22. The center seat portion of the terminal bridge has a mounting hole through which a connecting screw can pass to connect to the standoff 14 of the power device 13. Each of these edge punches narrows the width of the bridge web and allows twisting at two points. At each of the points the bridge can also be bent as well as twisted.

Figure 3A:
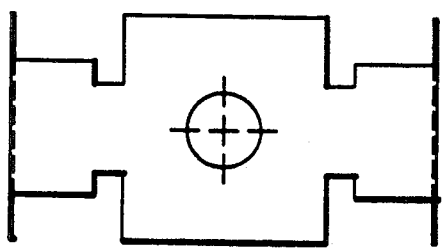
FIG. 3 shows a top, end and side view of the deformable terminal shown in FIG. 2 as FIGS. 3a, 3b and 3c, respectively.
Figure 3C:
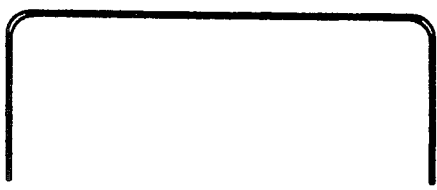
Figure 3B:
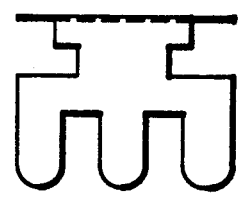

The terminal bridge ultimately has the shape shown by the perspective view of FIG. 2. However, the bridge 11 is designed so that it can be made in mass volumes at low cost by progressive die stamping. The bridge is initially made of a flat strip connected to the progressive die web with the center seat section illustrated by the top view of FIG. 3a and the bridge end portion illustrated by the side view of FIG. 3b formed as a flat part. Then the bridge is cut from the die web and during or after this process it is deformed so that it has a side view as shown in FIG. 3c. The result is the terminal of FIG. 2.

The illustrated printed circuit board terminal of FIG. 2 can handle currents of up to 20 amps. However, the basic design can be scaled up or down to handle more or less current. The terminal is made such that it can accommodate other applications where several loosely controlled high current terminations must be made to a common printed circuit board.

FIG. 1 illustrates the assembly of the terminal mounted to a base member functioning as a heatsink. Between the printed circuit board the power devices in the form of high power transistors are mounted to the heatsink. The spacer terminal posts 14 are torqued into the power device and protrude through the appropriate clearance held in the printed circuit board. The assembly allows a plus or minus 1.5 mm from the mounting base. The range of tolerance, as previously stated, also allows for a non-perpendicular alignment.

The terminal bridge connector is preferably made of copper, 0.25 mm thick, and preferably tinned, so that it may be soldered to the printed circuit board when a screw is inserted through the terminal and torqued to the threaded spacer terminal post. The terminal bridge connector 11 will conform to the height and connect without deflecting the printed circuit board.

While I have disclosed these inventions by way of illustration of the preferred embodiment, the accompanying claims should be understood to encompass all the breadth that can be construed, protecting the inventions to the fullest extent possible under the law in light of existing prior work of others. Those skilled in the art upon reading this disclosure, both now and in the future, will undoubtedly conceive of further adaptations and improvements, even by way of invention, which fall within the intended scope of the claims.

What is claimed is:

1. An electrical assembly having a plurality of terminals attached to a printed circuit board, comprising:
    a base member,
    a printed circuit board having circuit lines formed thereon,
    a plurality of electrical devices attached to said base member,
    a terminal post projecting up through said printed circuit board for connecting an attached one of said electrical devices to said printed circuit board,
    a terminal bridge connector connected electrically to a circuit line of said printed circuit board,
    said terminal bridge connector being electrically connected to a terminal post for each of said electrical devices by a screw passing through a mounting hole aperture of said terminal bridge and torqued into said terminal post and seated for an electrical connection to said terminal bridge connector at a seat portion thereof, said terminal bridge connector being deformable to accommodate movement of parts of the assembly and facilitates rework and different vertical spacing of the location of said seat portion and misalignment of said mounting hole and terminal post.

2. The electrical assembly according to claim 1 wherein said terminal bridge connector is located directly above the printed circuit board though which the terminal posts protrude for connection to the electrical devices mounted on said base plate member.

3. The electrical assembly according to claim 1 wherein said deformable bridge terminal connector when soldered onto the printed circuit card provides for a flexible high current interface between the electrical device and said printed circuit board, and where the terminal bridge is inserted for electrical conduction with a solder connection to the printed circuit board to provide a circuit connection to the electrical device.

4. The electrical assembly according to claim 1 wherein said deformable bridge terminal connector is formed so as to permit three directional deformable pitch, roll, and yaw movement as well as permitting movement up and down with respect to the surface of the printed circuit board to provide a positive low resistance high current connection to the power devices and which can be disconnected by unscrewing screws connecting the terminal bridge from said terminal post which is connected to the electrical device of the assembly.

5. The electrical assembly according to claim 1 wherein said deformable terminal bridge connector between the terminal posts and the printed circuit board accommodates the deformation permits differing alignment of location, height and pitch, roll and yaw of the seat of a connector screw coupling the terminal bridge to the electrical devices on the base member.

6. The electrical assembly according to claim 1 wherein said terminal bridge connector permits connections of some electrical devices having terminal posts higher or lower than other of the terminal posts without affecting the printed circuit board and to draw solder down from the terminal bridge end to the connecting circuit.

7. The electrical assembly according to claim 1 wherein said terminal bridge has two points allowing torsion of a connecting seat portion.

8. The electrical assembly according to claim 1 wherein said terminal bridge has two points allowing torsion of a connecting seat portion and the points are provided by a narrowing of the width of the terminal bridge which allows the bridge to be bent and twisted at two points on either side of the connection seat of the bridge.

* * * * *